United States Patent
Chen

(10) Patent No.: US 12,099,083 B2
(45) Date of Patent: Sep. 24, 2024

(54) DETECTION APPARATUS AND ANTI-BENDING DEVICE THEREOF

(71) Applicant: JTRON TECHNOLOGY CORP., Hsinchu (TW)

(72) Inventor: Chen-Nan Chen, Hsinchu (TW)

(73) Assignee: JTRON TECHNOLOGY CORP., Hsinchu (TW)

( * ) Notice: Subject to any disclaimer, the term of this patent is extended or adjusted under 35 U.S.C. 154(b) by 281 days.

(21) Appl. No.: 17/680,204

(22) Filed: Feb. 24, 2022

(65) Prior Publication Data
US 2023/0013390 A1    Jan. 19, 2023

(30) Foreign Application Priority Data
Jul. 19, 2021   (TW) .................................. 110208409

(51) Int. Cl.
| | |
|---|---|
| *G01R 31/28* | (2006.01) |
| *G01R 1/04* | (2006.01) |
| *G01R 1/067* | (2006.01) |
| *G01R 1/073* | (2006.01) |
| *G01R 31/20* | (2006.01) |
| *G01R 31/26* | (2020.01) |

(52) U.S. Cl.
CPC ..... *G01R 31/2808* (2013.01); *G01R 1/07307* (2013.01)

(58) Field of Classification Search
CPC ........ G01R 31/02; G01R 31/20; G01R 31/26; G01R 31/28; G01R 31/2808; G01R 31/2884; G01R 31/2889; G01R 1/04; G01R 1/06; G01R 1/067; G01R 1/073
See application file for complete search history.

(56) References Cited

U.S. PATENT DOCUMENTS

| | | | | |
|---|---|---|---|---|
| 9,372,227 | B2* | 6/2016 | Wang | ................ G01R 31/2889 |
| 2017/0054240 | A1* | 2/2017 | Lee | .......................... G01R 1/02 |

* cited by examiner

*Primary Examiner* — Neel D Shah
(74) *Attorney, Agent, or Firm* — Li & Cai Intellectual Property Office

(57) ABSTRACT

A detection apparatus and an anti-bending device thereof are provided. The detection apparatus includes a probe card circuit board, at least one probe, and the anti-bending device. The probe card circuit board has a first board surface and a second board surface on opposite sides thereof. The at least one probe is mounted on the first board surface. The anti-bending device includes an anti-bending frame, at least one sensor, a processing circuit, and a transmission part. The anti-bending frame is mounted on the second board surface of the probe card circuit board, and the at least one sensor is disposed on the anti-bending frame or the probe card circuit board. The processing circuit is disposed inside the anti-bending frame. The transmission part is mounted on the anti-bending frame, and is electrically coupled to the processing circuit.

5 Claims, 5 Drawing Sheets

DETECTION APPARATUS AND ANTI-BENDING DEVICE THEREOF

CROSS-REFERENCE TO RELATED PATENT APPLICATION

This application claims the benefit of priority to Taiwan Patent Application No. 110208409, filed on Jul. 19, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a detection apparatus and an anti-bending device thereof, and more particularly to a detection apparatus and an anti-bending device thereof that can be used for a wafer testing or an IC testing.

BACKGROUND OF THE DISCLOSURE

Conventionally, testing tools such as test boards or probe cards are often used to perform the testing of semiconductors or wafers. Since the testing tools are subjected to a force during testing, these testing tools are usually mounted with a stiffener for improvement of their mechanical strength. For instance, the stiffener (such as a frame) can be used to lock onto the probe card, so as to improve the mechanical strength of the probe card. Accordingly, the probe card will not be deformed from the impact of the force.

Nowadays, as the complexity and accuracy requirements of semiconductor test conditions continue to increase, in addition to a measurement signal of the device under test to be measured, monitoring of a measurement environment, an apparatus, and a state of a fixture has become increasingly important as well. In order to address the above-mentioned test requirements, there is also a growing need to apply the developing Internet of Things (IoT) technology to semiconductor or wafer testing.

Therefore, how to apply related technologies in a testing process through an improvement in structural design, so as to reduce the occurrence of problems in the testing process and improve the production efficiency of the test, has become one of the important issues to be solved in the related art.

SUMMARY OF THE DISCLOSURE

In response to the above-referenced technical inadequacies, the present disclosure provides a detection apparatus and an anti-bending device thereof, so as to effectively overcome issues that may occur in a conventional testing process.

In one aspect, the present disclosure provides a detection apparatus that includes a probe card circuit board, at least one probe, and an anti-bending device. The probe card circuit board has a first board surface and a second board surface on opposite sides thereof. The at least one probe is mounted on the first board surface of the probe card circuit board, and the at least one probe is electrically coupled to the probe card circuit board. The anti-bending device includes an anti-bending frame, at least one sensor, a processing circuit, and a transmission part. The anti-bending frame is mounted on the second board surface of the probe card circuit board. The at least one sensor is disposed on the anti-bending frame or the probe card circuit board, and the at least one sensor is configured to detect environmental data gathered when the detection apparatus performs detection. The processing circuit is disposed inside the anti-bending frame, and is electrically coupled to the at least one sensor. The processing circuit is configured to process and transmit the environmental data from the sensor. The transmission part is mounted on the anti-bending frame, and is electrically coupled to the processing circuit.

In another aspect, the present disclosure provides a detection apparatus that includes a chip test circuit board, at least one chip test probe, and an anti-bending device. The chip test circuit board has a first board surface and a second board surface on opposite sides thereof. The at least one chip test probe is mounted on the first board surface of the chip test circuit board, and the at least one chip test probe is electrically coupled to the chip test circuit board. The anti-bending device includes an anti-bending frame, at least one sensor, a processing circuit, and a transmission part. The anti-bending frame is mounted on the second board surface of the chip test circuit board. The at least one sensor is disposed on the anti-bending frame or the chip test circuit board, and the at least one sensor is configured to detect environmental data gathered when the detection apparatus performs detection. The processing circuit is disposed inside the anti-bending frame, and is electrically coupled to the at least one sensor. The processing circuit is configured to process and transmit the environmental data from the sensor. The transmission part is mounted on the anti-bending frame, and is electrically coupled to the processing circuit.

In yet another aspect, the present disclosure provides an anti-bending device that includes an anti-bending frame, at least one sensor, a processing circuit, and a transmission part. The anti-bending frame has a plurality of fixed edges partly arranged on edges thereof. The at least one sensor is disposed on the anti-bending frame. The processing circuit is disposed inside the anti-bending frame, and is electrically coupled to the at least one sensor. The transmission part is mounted on the anti-bending frame, and is electrically coupled to the processing circuit.

Therefore, in the detection apparatus and the anti-bending device thereof provided by the present disclosure, by virtue of the anti-bending frame having the fixed edges arranged formed on the edges thereof, the at least one sensor being disposed on the anti-bending frame, and the processing circuit being disposed inside the anti-bending frame and electrically coupled to the at least one sensor and the transmission part being mounted on the anti-bending frame and electrically coupled to the processing circuit, new functions can be provided to a conventional anti-bending frame. Through use of the at least one sensor that is disposed on the anti-bending frame, a temperature, pressure and other environmental data during a detection process can be detected. Accordingly, the anti-bending frame can provide functions of strengthening the mechanical strength of the probe card circuit board and collecting information.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
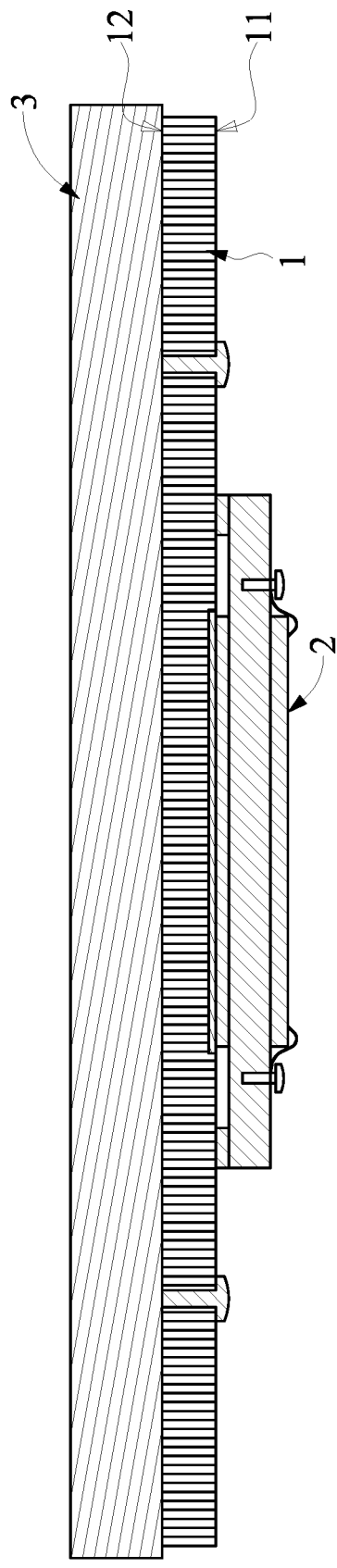
FIG. 1 is a schematic side view of a detection apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides a detection apparatus 100 that is used to perform a wafer test. The detection apparatus 100 includes a probe card circuit board 1, at least one probe 2, and an anti-bending device 3. For the sake of brevity, the structure of each component of the detection apparatus 100 will be described in sequence, and the connection relationship of the components of the detection apparatus 100 will be described in due course.

It should be noted that in the present embodiment, the anti-bending device 3 is described together with the probe card circuit board 1 and the at least one probe 2. However, in other embodiments not shown in the present disclosure, the anti-bending device 3 can also be independently used (e.g., sold) or used in cooperation with other components.

As shown in FIG. 1, in the present embodiment, the probe card circuit board 1 is a single-layer printed circuit board. In addition, the probe card circuit board 1 has a first board surface 11 and a second board surface 12 on opposite sides thereof. The first board surface 11 is laid with a plurality of copper foil wires (not shown), but the present disclosure is not limited thereto. For instance, in other embodiments not shown in the present disclosure, the probe card circuit board 1 can also be a double-layer printed circuit board or a multi-layer printed circuit board.

It should be noted that a structural improvement of the above-mentioned probe card circuit board 1 is not the focus of the present disclosure, and will not be further described herein. Next, the at least one probe 2 will be described.

As shown in FIG. 1, the at least one probe 2 is mounted on the first board surface 11 of the probe card circuit board 1, and the at least one probe 2 is electrically coupled to the probe card circuit board 1. Specifically speaking, the at least one probe 2 can directly transmit or receive signals from the probe card circuit board 1. When the at least one probe 2 is used to test a wafer, the signals received through the probe card circuit board 1 can be directly transmitted to a test machine that is electrically coupled to the detection apparatus 100 for interpretation.

In continuation of the above, in the present embodiment, the probe card circuit board 1 and the at least one probe 2 together form a probe card that is a MEMS-type probe card, but the present disclosure is not limited thereto. For instance, in other embodiments not shown in the present disclosure, the probe card can be a cantilever-type probe card or a vertical-type probe card.

Figure 2:
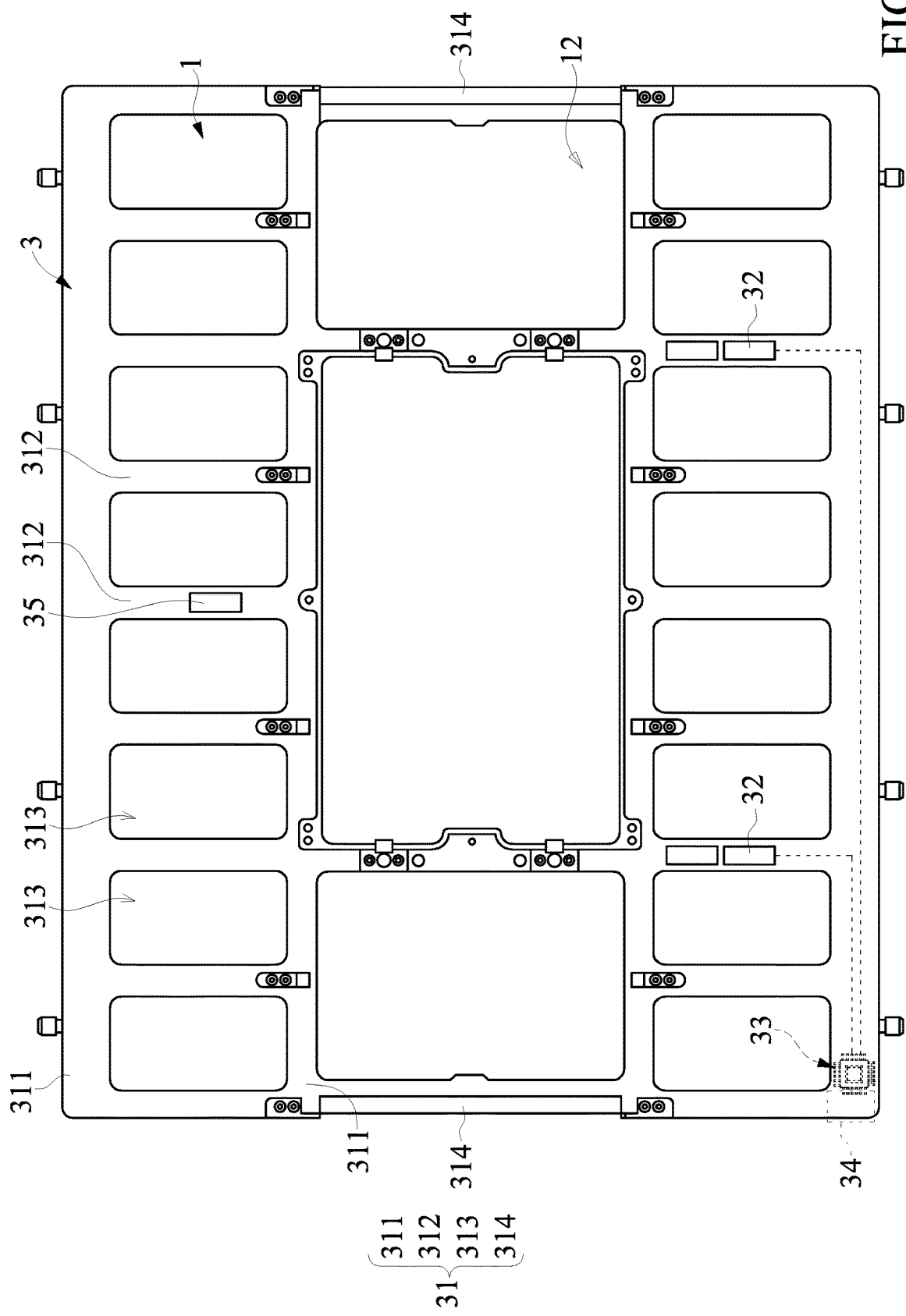
FIG. 2 is a schematic top view of the detection apparatus according to the first embodiment of the present disclosure.
Figure 4:
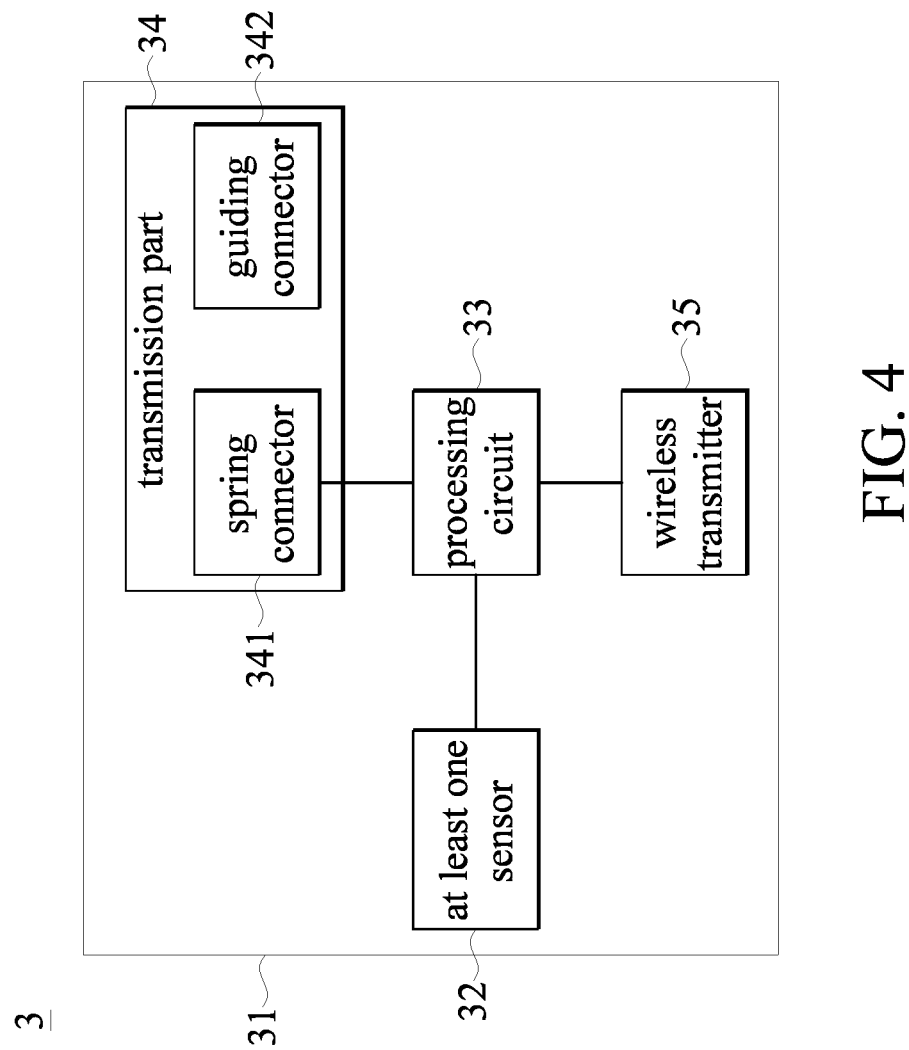
FIG. 4 is a block diagram of an anti-bending device according to the first embodiment of the present disclosure.

This concludes descriptions regarding the probe card, and the anti-bending device 3 will be described next. As shown in FIG. 2 and FIG. 4, the anti-bending device 3 includes an anti-bending frame 31, at least one sensor 32, a processing circuit 33, a transmission part 34, and a wireless transmitter 35, and the wireless transmitter 35 is electrically coupled to the processing circuit 33. However, the present disclosure is not limited thereto. For instance, in other embodiments not shown in the present disclosure, the anti-bending device 3 can also be provided without the wireless transmitter 35.

In the following paragraphs, various components of the anti-bending device 3 will be described in sequence, and the connection relationship of the various components of the anti-bending device 3 will be described in due course.

As shown in FIG. 2, the anti-bending frame 31 is mounted on the second board surface 12 of the probe card circuit board 1. Further, the anti-bending frame 31 includes a plurality of first support boards 311, a plurality of second support boards 312, a plurality of hollow portions 313, and a plurality of fixed edges 314.

Specifically, the first support boards 311 are connected to the second support boards 312, and a length direction of each of the first support boards 311 is perpendicular to a length direction of each of the second support boards 312. Any two of the first support boards 311 that are adjacent to each other and the second support boards 312 can together form the hollow portions 313.

It should be noted that, in the present embodiment, the fixed edges 314 are formed on the second support boards 312 that are adjacent to edges of the probe card circuit board 1, and the fixed edges 314 can be used to improve the mechanical strength of edges of the anti-bending frame 31. This concludes descriptions regarding the anti-bending frame 31, and the at least one sensor 32 will be described hereinafter.

As shown in FIG. 2, the at least one sensor 32 is disposed on the anti-bending frame 31 or the probe card circuit board 1, and the at least one sensor 32 is configured to detect environmental data gathered when the detection apparatus 100 performs detection. In the present embodiment, the at least one sensor 32 is preferably disposed outside of the anti-bending frame 31, but is not limited thereto. For instance, in other embodiments of the present disclosure, the at least one sensor 32 can be disposed inside the anti-bending frame 31 or on the second board surface 12 of the probe card circuit board 1.

More specifically, according to practical requirements, the at least one sensor 32 can be adjusted and be disposed on any acceptable location of the detection apparatus 100. That is, the at least one sensor 32 can be disposed on any location that does not affect the operation of the detection apparatus 100.

Specifically, in the present embodiment, the at least one sensor 32 is a temperature sensor, and a quantity of the at least one sensor 32 is four. However, the present disclosure is not limited thereto. For instance, in other embodiments not shown in the present disclosure, the at least one sensor 32 can be a pressure sensor or other types of sensors. Further, the at least one sensor 32 can be adjusted according to practical requirements. This concludes descriptions regarding the at least one sensor 32, and the processing circuit 33 and the transmission part 34 will be described hereinafter.

Figure 3:
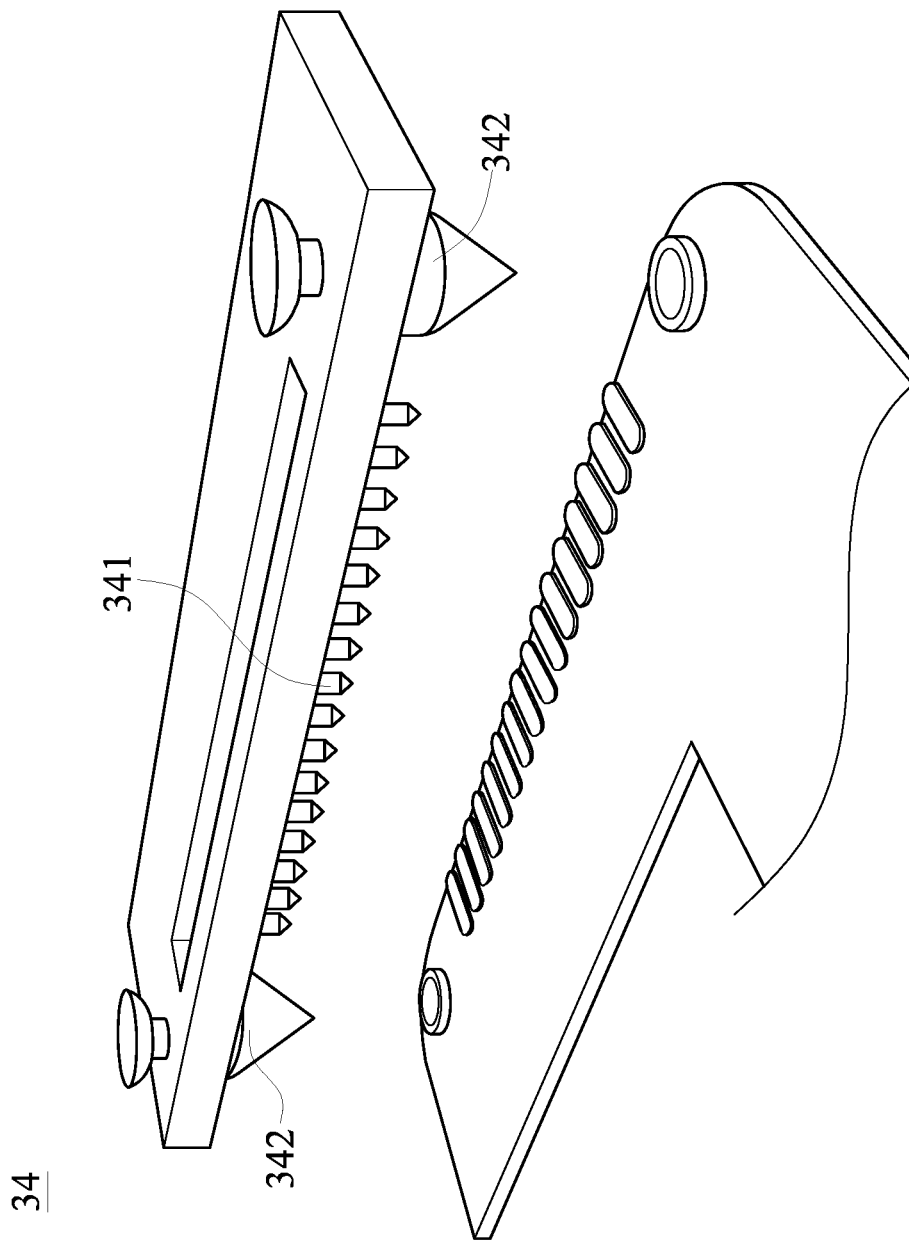
FIG. 3 is a schematic perspective view of a transmission part according to the first embodiment of the present disclosure.

As shown in FIG. 2 to FIG. 4, the transmission part 34 is mounted on the anti-bending frame 31, and the processing circuit 33 is disposed inside the anti-bending frame 31. The transmission part 34 is electrically coupled to the processing circuit 33, and the processing circuit 33 is electrically coupled to the at least one sensor 32.

In the present embodiment, the transmission part 34 is preferably disposed at a corner of the anti-bending frame 31. Accordingly, when the at least one sensor 32 generates the environmental data, the environmental data can be received and processed by the processing circuit 33.

Specifically speaking, the transmission part 34 includes a spring connector 341 and a plurality of guiding connectors 342 adjacent to the spring connector 341, and the spring connector 341 is electrically coupled to the processing circuit 33, but the present disclosure is not limited thereto. For instance, in other embodiments not shown in the present disclosure, the transmission part 34 can include a board-to-board connector and a ribbon cable that is connected to the board-to-board connector, the board-to-board connector is electrically coupled to the processing circuit 33, and the ribbon cable is not mounted on the anti-bending frame 31.

It should be noted that the transmission part 34 can be used to be electrically connected to an external inspection machine (not shown), and the transmission part 34 can transfer the environment data processed by the processing circuit 33 to the external inspection machine for further analysis and integration.

Second Embodiment

Figure 5:
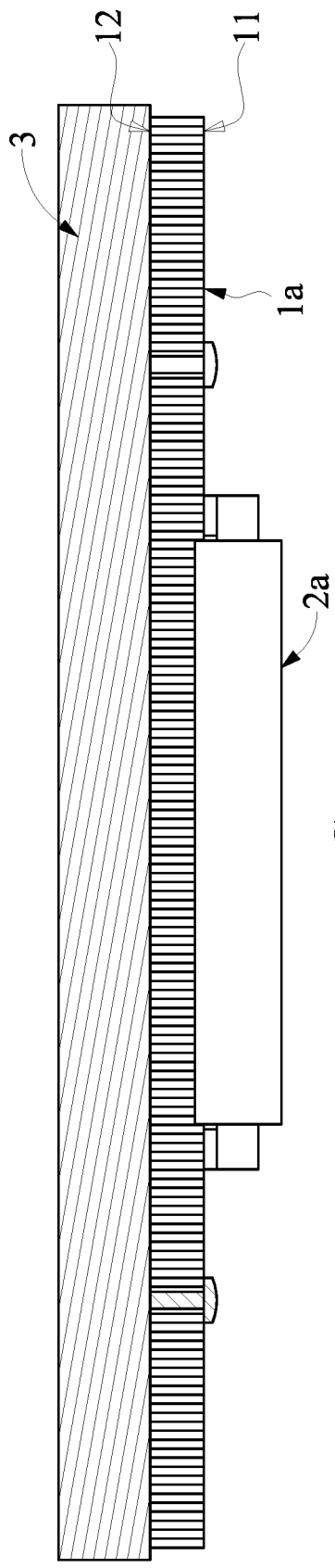
FIG. 5 is a schematic side view of a detection apparatus according to a second embodiment of the present disclosure.

Referring to FIG. 5, a second embodiment of the present disclosure is provided. Since the second embodiment is similar to the above-mentioned first embodiment, the similarities between these two embodiments (e.g., the probe card circuit board 1) will not be reiterated herein. Moreover, quantities and appearances shown in the drawing of this embodiment are provided for exemplary purposes only, and are not meant to limit the scope of the present disclosure.

The main difference between the present embodiment and the first embodiment is that: the probe card circuit board 1 and the at least one probe 2 of the first embodiment are respectively changed to a chip test circuit board 1a and at least one chip test probe 2a in the present embodiment. Specifically, as shown in FIG. 5, the chip test circuit board 1a has a first board surface 11 and a second board surface 12 on opposite sides thereof, and the at least one chip test probe 2a is mounted on the first board surface 11 of the chip test circuit board 1a. The at least one chip test probe 2a is electrically coupled to the chip test circuit board 1a.

Specifically speaking, the at least one chip test probe 2a can directly transmit or receive signals from the chip test circuit board 1a. When the at least one chip test probe 2a is tested, the signals received through the chip test circuit board 1a can be directly transmitted to a test machine that is electrically coupled to the detection apparatus 100 for interpretation.

In continuation of the above, in this embodiment, the chip test circuit board 1a and the at least one chip test probe 2a are formed together to be an IC test board. Accordingly, the detection apparatus 100 and the anti-bending device 3 thereof can be used to detect the environment data gathered when the detection apparatus 100 performs detection. Furthermore, the mechanical strength of the probe card circuit board 1 (or the chip test circuit board 1a) can be improved.

BENEFICIAL EFFECTS OF THE EMBODIMENTS

In conclusion, in the detection apparatus 100 and the anti-bending device 3 thereof provided by the present disclosure, by virtue of the anti-bending frame 31 having fixed edges 314 arranged formed on the edges thereof, the at least one sensor 32 being disposed on the anti-bending frame 31, and the processing circuit 33 being disposed inside the anti-bending frame 31 and electrically coupled to the at least one sensor 32 and the transmission part 34 being mounted on the anti-bending frame 31 and electrically coupled to the processing circuit 33, new functions can be provided to a conventional anti-bending frames. Through use of the at least one sensor 32 that is disposed on the anti-bending frame 31, a temperature, pressure and other environmental data during a detection process can be detected. Accordingly, the anti-bending frame 31 can provide functions of strengthening the mechanical strength of the probe card circuit board 1 and collecting information.

Furthermore, by virtue of the transmission part 34 including the spring connector 341 and the guiding connectors 341 adjacent to the spring connector 341, and the spring connector 341 being electrically coupled to the processing circuit 33, the transmission part 34 can be fixedly connected to the external inspection machine.

Furthermore, by virtue of the anti-bending device 3 further including the wireless transmitter 35 that is electrically coupled to the processing circuit 33, the environmental data can be transmitted to the external inspection machine without the transmission part 34.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A detection apparatus, comprising:
 a probe card circuit board having a first board surface and a second board surface on opposite sides thereof;
 at least one probe mounted on the first board surface of the probe card circuit board, wherein the at least one probe is electrically coupled to the probe card circuit board; and
 an anti-bending device, wherein the anti-bending device includes:
  an anti-bending frame mounted on the second board surface of the probe card circuit board;
  at least one sensor disposed on the anti-bending frame or the probe card circuit board, wherein the at least one sensor is configured to detect environmental data gathered when the detection apparatus performs detection;
  a processing circuit disposed inside the anti-bending frame and electrically coupled to the at least one sensor, wherein the processing circuit is configured to process and transmit the environmental data; and
  a transmission part mounted on the anti-bending frame and electrically coupled to the processing circuit, wherein the transmission part includes a spring connector and a plurality of guiding connectors adjacent to the spring connector, and the spring connector is electrically coupled to the processing circuit.

2. The detection apparatus according to claim 1, wherein the anti-bending frame further has a plurality of fixed edges partly arranged on edges thereof, and the fixed edges are formed on a side of the anti-bending frame that is relatively away from the second board surface.

3. The detection apparatus according to claim 1, wherein the anti-bending device further includes a wireless transmitter that is electrically coupled to the processing circuit.

4. A detection apparatus, comprising:
 a chip test circuit board having a first board surface and a second board surface on opposite sides thereof;
 at least one chip test probe mounted on the first board surface of the chip test circuit board, wherein the at least one chip test probe is electrically coupled to the chip test circuit board; and
 an anti-bending device, wherein the anti-bending device includes:
  an anti-bending frame mounted on the second board surface of the chip test circuit board;
  at least one sensor disposed on the anti-bending frame or the chip test circuit board, wherein the at least one sensor is configured to detect environmental data gathered when the detection apparatus performs detection;
  a processing circuit disposed inside the anti-bending frame and electrically coupled to the at least one sensor, wherein the processing circuit is configured to process and transmit the environmental data; and
  a transmission part mounted on the anti-bending frame and electrically coupled to the processing circuit, wherein the transmission part includes a board-to-board connector and a ribbon cable connected to the board-to-board connector, the board-to-board connector is electrically coupled to the processing circuit, and the ribbon cable is not mounted on the anti-bending frame.

5. An anti-bending device, comprising:
 an anti-bending frame having a plurality of fixed edges partly arranged on edges thereof;
 at least one sensor disposed on the anti-bending frame;
 a processing circuit disposed inside the anti-bending frame and electrically coupled to the at least one sensor; and
 a transmission part mounted on the anti-bending frame and electrically coupled to the processing circuit, wherein the transmission part includes a spring connector and a plurality of guiding connectors adjacent to the spring connector, and the spring connector is electrically coupled to the processing circuit.

* * * * *